United States Patent

Fukaya et al.

[11] 4,035,744
[45] July 12, 1977

[54] SAWTOOTH WAVE OSCILLATOR CIRCUIT

[75] Inventors: Firokazu Fukaya; Katsuhiro Takagi, both of Tokyo, Japan

[73] Assignee: Nippon Electric Company, Ltd., Tokyo, Japan

[21] Appl. No.: 717,198

[22] Filed: Aug. 24, 1976

[30] Foreign Application Priority Data

Aug. 28, 1975 Japan .......................... 50-104386

[51] Int. Cl.² .......................................... H03K 4/50
[52] U.S. Cl. .................................. 331/111; 328/68; 331/150
[58] Field of Search ........... 331/108 C, 108 D, 111, 331/143, 150; 307/294; 328/66, 67, 68

[56] References Cited

U.S. PATENT DOCUMENTS

| | | | |
|---|---|---|---|
| 3,364,441 | 1/1968 | Rogers | 331/111 |
| 3,432,772 | 3/1969 | Johnsen et al. | 331/111 |
| 3,742,384 | 6/1973 | Breitzmann et al. | 331/111 |
| 3,886,485 | 5/1975 | Takahashi | 331/111 |
| 3,904,988 | 9/1975 | Hsiao | 331/111 |
| 3,946,330 | 3/1976 | Takahashi | 331/111 |
| 3,967,216 | 6/1976 | Sakamoto et al. | 331/111 |

Primary Examiner—John Kominski
Attorney, Agent, or Firm—Hopgood, Calimafde, Kalil, Blaustein & Lieberman

[57] ABSTRACT

A sawtooth oscillator comprises a differential amplifier and first and second switching transistors driven into opposite conductivity states by the output of the differential amplifier. A charging capacitor is connected between the switching transistors and has one end connected in positive feedback fashion to one input of the differential amplifier.

3 Claims, 8 Drawing Figures

SAWTOOTH WAVE OSCILLATOR CIRCUIT

The present invention relates generally to a circuit for generating sawtooth waves, and more particularly to a sawtooth wave oscillator suited for fabrication as a semiconductor integrated circuit.

Sawtooth wave oscillators are typically formed of a blocking oscillator combined with a transformer. Such oscillators, however, cannot be fabricated as a semiconductor integrated circuit, because there is no practical technique to form a transformer in a semiconductor device. A proposed solution to this problem which involves the use of an external transformer necessitates extra terminals on a seimconductor IC chip, which would result in an increase in the chip size and a reduced yield and reliability of the IC device. Moreover, the oscillation frequency would fluctuate due a temperature rise caused by the operation of the chip. Another known type of sawtooth wave oscillator, which employs a multivibrator, requires a number of capacitors which generally occupy a very large area on a semiconductor IC chip. This makes the chip size impractically large. Therefore, these capacitors must be externally connected to the IC chip, which necessitates extra terminals on the IC chip. This results in an increase in the chip size and a fluctuation in the oscillation frequency due to temperature rise caused by the operation of the chip.

Accordingly, a principal object of the present invention is to provide a sawtooth wave oscillator circuit that is suited for fabrication as a semiconductor integrated circuit.

With this and other objects in view, the invention provides an oscillator comprising a differential amplifier having two input terminals one of which is supplied with a reference potential. First and second switching means are driven into an on or off state simultaneously by an output of the differential amplifer. A charge storing means installed between the first and second switching means, has one end connected, in a positive feedback fashion, to the other input terminal of the differential amplifier. The first switching means, the charge storing means and the second switching means are connected in series between two terminals of a power supply.

The oscillator of this invention requires only a minimum number of external circuit elements and maintains stable oscillation against temperature changes. The number of terminals on an IC chip can be minimized, because a synchronizing trigger signal can be applied directly to an oscillation capacitor terminal. The operation of this circuit is stable irrespective of the output impedance of the trigger signal source. These features enable the oscillator of the inventon to be efficiently fabricated as a semiconductor integrated circuit.

The above and further objects, features and advantages of the present invention will become more apparent from the following detailed description taken in conjunction with the accompanying drawings; wherein.

Figure 1:
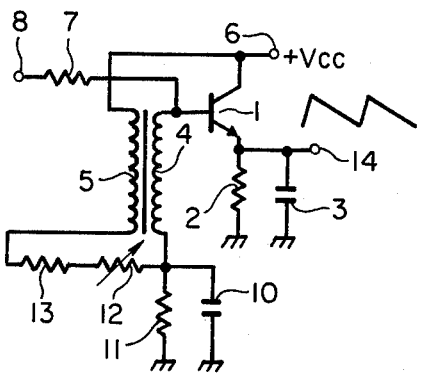
FIG. 1 is a circuit diagram of a prior art blocking oscillator.

The prior art sawtooth wave oscillator, as illustrated in FIG. 1, comprises a transistor having a collector connected to a power source ($V_{cc}$) terminal 6 and an emitter connected to ground through a parallel circuit of a resistor 2 and a capacitor 3, and thence to an output terminal 14. The transistor 1 has a base connected through a resistor 7 to a trigger signal input terminal 8. The transistor base is biased through a transformer primary winding 4 to a divided voltage of the power supply $V_{cc}$ by resistors 11, 12 and 13. A capacitor 10 is connected to ground in parallel to the resistor 11. One end of the transformer secondary winding 5 is connected to the resistor 13, and the other end of winding 5 is connected to the power supply terminal 6. Although this type of oscillator is virtually free of misoperation ascribed to noise entry to the trigger input terminal 8, the oscillator must rely upon the transformer, which has hindered the fabrication of the oscillator as an integrated circuit.

Figure 2:
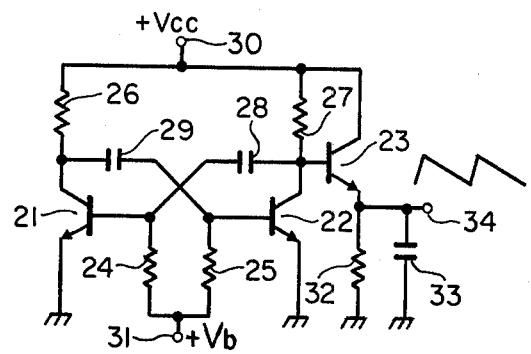
FIG. 2 is a circuit diagram of a prior art multivibrator oscillator.

Another prior art oscillator, shown in FIG. 2, comprises transistors 21 and 22 which have their emitters grounded and their collectors connected through resistors 26 and 27 to a power source ($V_{cc}$) terminal 30. The bases of transistors 21 and 22 are connected through capacitors 28 and 29 to the collectors of the opposite transistors and supplied with bias voltages, respectively, through resistors 24 and 25 connected in parallel to a bias voltage supply terminals 31. The collector of the transistor 22 is further connected to the base of the transistor 23, and the collector of the transistor 23 is connected to the power supply terminal 30 and its emitter is connected to ground through a parallel circuit of a resistor 32 and a capacitor 33. The oscillator output is derived from a terminal 34 led from the emitter of the transistor 23. Although this type of miltivibrator can be constructed of a relatively small number of constituent circuit elements and does not require a transformer, the multivibrator requires a number of capacitors, which is generally undesirable in semiconductor integrated circuits.

Figure 3:
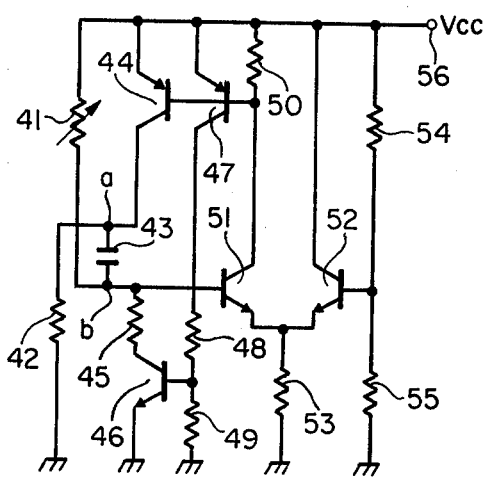
FIG. 3 is a circuit diagram of a sawtooth oscillator according to a first embodiment of this invention.

The sawtooth wave oscillator of the invention as illustrated in a first embodiment in FIG. 3, comprises NPN transistors 51 and 52, the emitters of which are connected in common to construct a differential amplifier. The transistor 51 has its collector connected to a load resistor 50, causing a PNP type switching transistor 47 to be biased. The collector of the transistor 47 is connected to a series circuit of resistors 48 and 49 used for biasing an NPN transistor 46. The collector of tranistor 46 is connected to a resistor 45. A variable resistor 41 is connected between a power source $V_{cc}$ and a junction point $b$ of the base of the transistor 51 and the resistor 45. The base of a switching PNP transistor 44 is connected to and biased by the resistor 50 and the emitter of transistor 44 is connected to power terminal 56. A resistor 42 is connected between ground and the collector of the transistor 44 at a junction point $a$. A capacitor 43 is connected between the junction points

*a* and *b*. The variable resistor 41 and the resistor 42 form a discharging path of the charge stored in the capacitor 43, and the switching transistors 44 and 46 and the resistor 45 form a charging path for the capacitor 43.

The oscillation frequency can be varied by changing the discharing-time constant of the capacitor 43 by means of the variable resistor 41. The reference potential for charge-discharge switching across the capacitor 43 is derived from the base potential of the transistor 52, i.e., the power source voltage $V_{cc}$ at the terminal 56 by division through resistors 54 and 55.

Figure 4:
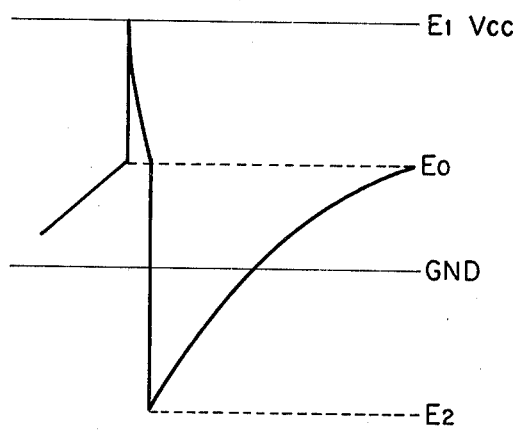
FIG. 4 is a diagram showing the waveform at a point $b$ of the circuit of FIG. 3.

The principles of oscillation of the oscillator of FIG. 3 are described by referring to the waveforms shown in FIG. 4. First, assume the capacitor 43 is discharged under the condition that the differential transistors 51 and 52 are in the off and on states, respectively. In this condition, the transistors 47, 44, and 46 are all in the off state, and the discharging path of power source $V_{cc}$ — variable resistor 41 — capacitor 43 — resistor 42 — ground is formed. When the base potential at the transistor 51 rises to the reference potential $E_O$ as the result of the capacitor 43 releasing its charge, the differential transistors 51 and 52 change their conduction states to on and off, respectively. Consequently, the transistors 47 and 44 are biased through the resistor 50 and turned to the on state simultaneously. The transistor 46 is also biased through resistors 48 and 49 and turned to the on state. As a result, a charging path for the capacitor 43 is formed by way of power source $V_{cc}$ — transistor 44 — capacitor 43 — resistor 45 — transistor 46 — ground, thus causing the capacitor 43 to be ready to be charged. Now, assume that before this charging path is formed, the charge in the capacitor 43 is zero as the result of discharge. At that moment, the base potential at the transistor 51 becomes equal to the power source voltage $V_{cc}$ when the transistor 44 turns to the on state. In other words, the charging of the capacitor 43 begins with the base voltage $E_1$ of the transistor 51 being equal to $V_{cc}$.

The time constant $\tau_1$ for charging the capacitor 43 is given as $\tau_1 = C_{43} \cdot R_{45}$. The charging time $T_1$ is expressed as $$T_1 = C_{43} \cdot R_{45} \cdot ln(E_1/E_0)$$

where $E_0 = R_{49}/(R_{48} + R_{49}) V_{cc}$ and $E_1 = V_{cc}$. Therefore, $$T_1 = C_{43} \cdot R_{45} \cdot ln (1 + R_{48}/R_{49}) \tag{1}$$

Next consider the period during which the capacitor 43 is discharged. At the moment the base potential at the transistor 51 reaches the reference potential $E_0$ after the charging time $T_1$, the differential transistors 51 and 52 reverse their states into the off and on states respectively. Accordingly, the transistors 44, 46 and 47 are cut off concurrently, and the charging path for the capacitor 43 disappears, thereby forming a discharging path by way of capacitor 43 (point *b*) — variable resistor 41 — power sorce — ground — resistor 42 — capacitor 43 (point *a*). Discharging from the capacitor 43 starts immediately after the transistor 51 has turned off. At this moment, the point *a* is forced to be grounded through the resistor 42, with the result that the potential at the point *a* is equal to the ground potential despite the fact that the capacitor 43 is charged so as to store positive charge on the side of point *a* causing the base potential at the transistor 51 (i.e., the potential at point *b*) to fall to $E_2$ instantly. In this case, the potential shift from ground to $-E_2$ is equal to the charging potential across the capacitor 43, that is, $-E_2 = V_{cc} - E_0$. The time constant $\tau_2$ for discharging is given as $$\tau_2 = C_{43}(R_{41} + R_{42})$$

The discharging time $T_2$ is expressed as
$$T_2 = C_{43}(R_{41} + R_{42}) \, ln \, (2V_{cc} - E_0)/(V_{cc} - E_0),$$

where $E_0 = R_{49}/R_{48} + R_{49}) V_{cc}$. Therefore, $$T_2 = C_{43}(R_{41} + R_{42}) ln(2 + (R_{49}/R_{48})) \tag{2}$$

When the base potential at the transistor 51 reaches the reference potential $E_0$ after the discharging time $T_2$ as a result of discharging from the capacitor 43, the transistor 51 turns on, causing the capacitor 43 to start storing a charge.

In the above manner, oscillation is maintained at an oscillation period $T$ which is the sum of the charging time $T_1$ and the discharging time $T_2$. Thus, the oscillation frequency $f = 1/(T_1 + T_2)$. As is apparent from Eqs. (1) and (2), the oscillation period $T$ is irrelevant to the power source voltage $V_{cc}$ but depends upon the resistance ratio $R_{48}/R_{49}$ and not upon the resistance value itself. Hence the oscillator is highly suited for fabrication into a semiconductor integrated circuit, because the large deviation of the resistance value cannot be avoided but the resistance ratio among two resistors can be precisely controlled in a semiconductor integrated circuit.

The oscillator circuit of the invention can be integrated in a semiconductor chip with a minimum number of external circuit elements, i.e., a charging capacitor 43 and a frequency-adjusting variable resistor 41, of which the variable resistor may be replaced with a fixed resistor depending on the application of the circuit permitting the resistor 41 to be incorporated into an IC chip. When the oscillator is used in a television receiver, a vertical synchronizing signal generated through the integrator circuit may be applied directly to the point *a* or *b* of the oscillator shown in FIG. 3 without any change of the oscillation frequency due to inter-affection of the capacitors in the integrator circuit and in the oscillator. This serves to obviate the need for an extra terminal for trigger signal input by using the terminals for connecting the capacitor 43 also as the trigger input terminal. Hence, in the oscillator of the invention, the number of terminal pads on the IC chip can be minimized and the area of the semiconductor IC chip on which an oscillator is formed can be reduced.

Furthermore, in the oscillator according to the invention, the capacitor 43, upon storing a charge, starts discharging through the resistor 42. While discharging, the point *a* is fixed at a ground potential, and the point *b* assumes a negative potential. Accordingly, the potential at the point *b* becomes zero from $E_2$ as the capacitor 43 releases its charge, and the states of the transistors 51 and 52 remain unchanged until the capacitor 43 is charged to $E_0$. Thus, in other words, a sawtooth wave with a longer period can be obtained with a smaller capacity, or a capacitor 43 of small capacity wil suffice for the oscillator of the invention. This also causes an extremely linear sawtooth wave having a short period for charging the capacitor, i.e., the period not essential for a sawtooth wave.

In the circuit of FIG. 3, the transistors 44 and 47 can be replaced by a common transistor and the resistors 42 and 48 may be replaced by a common resistor. For example, the transistor 44 and the resistor 42 can be omitted by connecting the point *a* to the collector of the transistor 47, whereby a charging path is formed through the transistor 47 and a discharging path is formed through resistors 48 and 49. The oscillator output can be derived from any of the collectors of transistors 51 and 52, as well as from an output circuit driven by the collector output. In this circuit, if the feedback circuit comprising the capacitor 43 operates negatively, a phase inverter circuit must be inserted to maintain a positive feedback.

Figure 5:
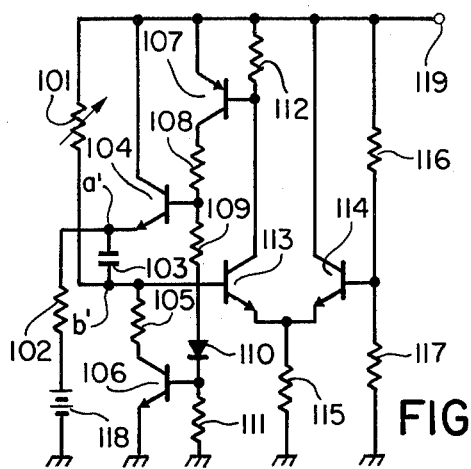
FIG. 5 is a circuit diagram of a sawtooth oscillator according to a second embodiment of this invention.

FIG. 5, illustrates a sawtooth oscillator according to a second embodiment of the invention which comprises differential transistors 113 and 114. The base of transistor 114 is connected to a junction between resistors 116 and 117 which are serially connected between a power supply terminal 119 and a ground potential. The base of transistor 113 is connected to one end of a capacitor 103 at a point *b'*. The emitters of the two transistors are grounded through a resistor 115, and the collector of transistor 113 is connected to a resistor 112 and to the base of a PNP transistor 107. The collector of transistor 107 is connected to a series circuit of resistors 108, 109, 110 and resistor 111. The base of an NPN transistor 104 is connected to a junction between resistors 108 and 109, and its emitter is connected to the other end of the capacitor 103 at a point *a'*, The transistor 104, a transistor 106 and a resistor 105 inserted between the point *b'* and the collector of the transistor 106 constitute a charging path for the capacitor 103. A variable resistor 101 for adjusting an oscillation frequency is connected to the point *b'*, and a resistor 102 biased by a biasing power source 118 is connected to the point *a'*. Varible resistor 101 and resistor 102 constitute a releasing path of the charge stored in the capacitor 103.

Figure 6:
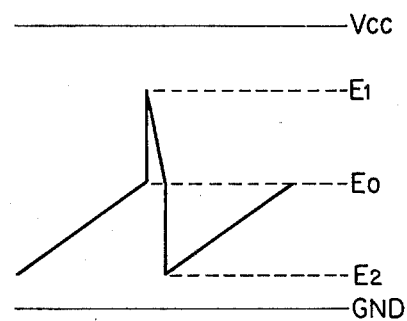
FIG. 6 is a diagram showing the waveform at a point $b'$ of the circuit of FIG. 5.

In the circuit of FIG. 3, the transistor 44 which serves as part of the charging circuit, is of the PNP type and hence, when the circuit is constructed in semiconductor integrated circuit form, its saturation resistance may affect the capacitor charging time. In addition, because the discharge starting voltage $E_2$ shifts below a ground potential, the substrate and the collector and base of the transistor 46 serve respectively as the emitter, base, and collector of a PNP type parasitic transistor. As a result, the potential $E_2$ is clamped to a value lower than the ground potential by the base-emitter potential $V_{BE}$, resulting in small amplitude and short period of output wave. If the amplitude of the output waveform is large, the transistors 51 and 52 may be destroyed due to a large reverse voltage applied between the base and the emitter. Such problems could be overcome in the circuit shown in FIG. 5. The base bias potential for the transistor 104 is led from the junction between the load resistors 108 and 109 of the transistor 107. In the waveform shown in FIG. 6, the charge starting voltage $E_1$ is lowered below the power source voltage $V_{cc}$ by the voltage drop of the resistor 108 and the emitter-base potential $V_{BE}$ of the transistor 104, and the discharge starting voltage $E_2$ is raised above the ground potential by the biasing power source 118. This makes it possible to reduce the output wave amplitude compared with that obtained in the circuit shown in FIG. 3 and to hold the potential at the point *b'* above the ground potential. Thus the substrate and the collector and base of the transistor 106 do not work as parasitic transistors 113 and 114 between the base and the emitter thereof. From the reliability point of view, this feature is desirable particularly when the oscillator is fabricated into a semiconductor integrated circuit.

Figure 7:
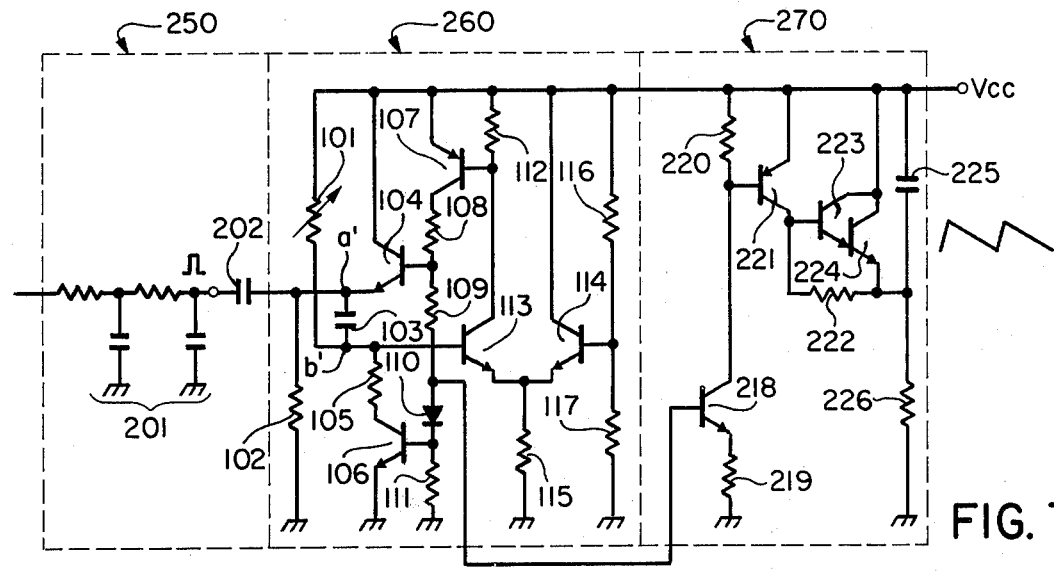
FIG. 7 is a circuit diagram showing one application of the embodiment of FIG. 5.

An example of an application of the oscillator circuit of FIG. 5 to a television receiver set is described in FIG. 7, which shows a circuit used for a vertical deflection circuit. That circuit comprises a vertical-synchronizing separator circuit 250, a sawtooth wave oscillator circuit 260 and a sawtooth wave output circuit 270. The oscillator circuit 260 is basically the same as that shown in FIG. 5 but is slightly modified such as the deletion of the biasing power source 118. The output circuit 270 has an integrator circuit comprising a capacitor 225 and a resistor 226. A sawtooth wave is generated across the capacitor 225 by switching through a transistor 224 in response to the output of the oscillator circuit 260. when the anode of a diode 110 is connected to the base of a transistor 218, the transistor 218 operates as a constant current source for the charging period for the capacitor 103. A transistor 221, which is biased by a load resistor 220 of the transistor 218, drives Darlington-paired transistors 223 and 224. The oscillation should be controlled by a vertical synchronizing signal of the television signal in order to make the sawtooth wave frequency perfectly coincident with the vertical synchronizing frequency. A synchronizing trigger pulse is applied to a point *a'*. The reliable frequency pulling takes place when the oscillation frequency is slightly lower than the trigger pulse repetition frequency, i.e., the vertical synchronizing frequency. Thus, the oscillator circuit performs synchronous oscillation.

Usually the trigger pulse is applied from the snychronizing signal separator circuit by way of the integrator circuit 250 and a capacitor 202. According to the invention, the oscillation capacitor 103 floats with respect to the power source or gound, which will necessitate two terminals when the circuit is integrated. On the other hand, the trigger pulse can be applied to any end of the oscillation capacitor without fear of frequency deviation, which reduces the number of terminals on an IC chip. According to the invention, synchronous oscillation is available when a trigger pulse is applied to the base of the transistor 113 or 114.

The low limit of synchronous pulling oscillation frequency with a trigger pulse applied depends on the amplitude of the trigger pulse relative to the amplitude of the oscillation waveform which is determined by the difference between $E_0$ and $E_2$ as in FIG. 4. In the oscillator of the invention, the snychronous pulling low-limit frequency can be adjusted by changing the value of the resistor 102 and thus changing the input impedances at trigger pulse applying point *a'*. The coupling capacitor 202 may be omitted when the snychronizing signal is superposed on the reference potential.

Operated in the foregoing manner, the circuit as in FIG. 7 provides a sawtooth wave signal that is synchronous with the vertical synchronizing signal. After amplitude and linearity adjustments, this output is amplified by a vertical output stage and then supplied to the deflection yoke.

The effect of the thermal deviation of the PN junction forward voltage at the transistors 104, 106 and diode 110 upon the oscillation frequency can be canceled by determining the resistance values of resistors 108 and 109 to the same value and/or applying a diode in series with resistors 116 and 117.

In the circuit of FIG. 5, the oscillation frequency is low when the power source voltage is below a given value, or at the beginning of the power supply, and thereafter rises to its steady value. This makes it possible for the vertical deflection circuit to start scanning on the TV screen in a stable synchronous pulling state.

Figure 8:
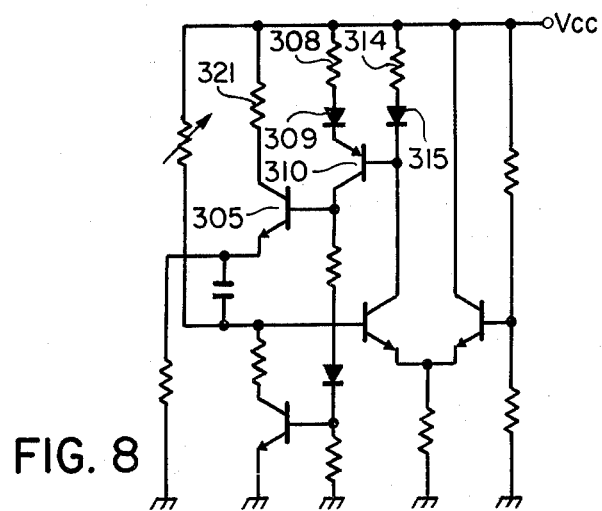
FIG. 8 is a circuit diagram of a sawtooth oscillator according to a third embodiment of this invention.

A third embodiment of the invention is schematically illustrated in FIG. 8 wherein a resistor 321 is inserted in the collector circuit of a transistor 305 and thus this transistor is used in a saturated state. A transistor 310 having an emitter connected to the power source $V_{cc}$ by way of a resistor 308 and a diode 309 is biased by a resistor 314 and a diode 315 and driven by a constant current. The base potential at the transistor 305 is thereby stabilized, permitting the dependence of oscillation frequency upon temperature to be markedly improved. The remaining circuit arrangement is the same as in the circuit of FIG. 5.

As has been described above, the oscillator circuit of the invention is simple in construction and operable with small dependence of oscillation frequency upon temperature. The oscillator circuit of the invention, therefore, is highly suited for fabrication into a semiconductor integrated circuit. It is apparent that the invention is not limited to what has been disclosed hereinbefore but is also applicable to other circuits that may be derived from the disclosed embodiments.

What is claimed is:

1. An oscillator circuit comprising a differential amplifier having first and second input terminals and an output terminal; means for applying a reference potential to the second input terminal of said amplifier; first and second switching means driven concurrently into an on or off state by the output of said amplifier; charge storing means having one end connected to said first switching means, the other end of said charge storing means being connected to said second switching means and to said first input terminal of said differential amplifier in a positive feedback fashion; means for discharging a charge stored in said charge storing means; and a power source connected across the series circuit of said first switching means, said charge storing means and said second switching means.

2. An oscillator circuit claimed in claim 1, wherein said discharging means comprises a first and a second conductive means, said first conductive means being connected across the series circuit of said charge storing means and said second switching means, and said second conductive means being connected across the series circuit of said charge storing means and said first switching means.

3. An oscillator circuit claimed in claim 2, wherein said discharging means further comprises a biasing means series coupled with said first conductive means.

* * * * *